(12) United States Patent
Vasadi et al.

(10) Patent No.: US 10,411,583 B2
(45) Date of Patent: Sep. 10, 2019

(54) SYSTEM AND METHOD FOR REDUCING OUTPUT HARMONICS

(71) Applicant: Silicon Laboratories Inc., Austin, TX (US)

(72) Inventors: Sriharsha Vasadi, Austin, TX (US); Mustafa H. Koroglu, Austin, TX (US); Sherry X. Wu, Austin, TX (US)

(73) Assignee: SILICON LABORATORIES INC., Austin, TX (US)

( * ) Notice: Subject to any disclaimer, the term of this patent is extended or adjusted under 35 U.S.C. 154(b) by 0 days.

(21) Appl. No.: 15/875,583

(22) Filed: Jan. 19, 2018

(65) Prior Publication Data

US 2019/0229608 A1 Jul. 25, 2019

(51) Int. Cl.
*H02M 1/10* (2006.01)
*H02M 1/12* (2006.01)
*H02J 3/01* (2006.01)
*H03F 3/21* (2006.01)
*H02M 1/00* (2006.01)

(52) U.S. Cl.
CPC ............... *H02M 1/126* (2013.01); *H02J 3/01* (2013.01); *H03F 3/21* (2013.01); *H02M 2001/0003* (2013.01)

(58) Field of Classification Search
CPC .................................................... H02M 1/106
See application file for complete search history.

(56) References Cited

U.S. PATENT DOCUMENTS

| | | | | |
|---|---|---|---|---|
| 5,124,668 A | * | 6/1992 | Christian | H03G 7/08 330/302 |
| 5,191,338 A | * | 3/1993 | Katz | H03F 1/3241 330/277 |
| 6,032,028 A | * | 2/2000 | Dickey | H03C 3/40 332/117 |
| 7,466,829 B1 | * | 12/2008 | Anderson | H03G 7/002 381/103 |
| 2006/0290444 A1 | * | 12/2006 | Chen | H03F 1/56 333/118 |
| 2012/0154054 A1 | * | 6/2012 | Kaczman | H03F 1/083 330/295 |

* cited by examiner

*Primary Examiner* — Patricia T Nguyen
(74) *Attorney, Agent, or Firm* — Polansky & Associates, P.L.L.C.; Paul J. Polansky

(57) ABSTRACT

In one form, a power amplifier system includes first and second amplification path, and a combination element. The first amplification path has an input for receiving a drive signal, and an output. The second amplification path has an input coupled to the input of the first amplification path, and an output. The second amplification path has a delay element that inserts a signal path delay with respect to the first amplification path, wherein the delay element has a delay corresponding to a harmonic that is desired to be reduced. The combination element is coupled to the output of the first amplification path and an output of the second amplification path, and provides an output signal as a sum of outputs of the first amplification path and the second amplification path.

25 Claims, 6 Drawing Sheets

SYSTEM AND METHOD FOR REDUCING OUTPUT HARMONICS

FIELD OF THE DISCLOSURE

The present disclosure relates generally to signal processing systems, and more particularly to signal processing systems such as power amplifiers that create unwanted harmonics.

BACKGROUND

Radio frequency (RF) power amplifiers are used in a variety of industrial and consumer products such as two-way radios and mobile phones. RF power amplifiers amplify a transmit signal up to a certain power level specified by regulatory authorities such as the United States Federal Communications Commission (FCC) and corresponding regulatory authorities in other countries. These regulatory authorities also specify emission limits for out-of-band signals created by, for example, unwanted harmonics generated in the RF power amplifier.

In products with transmit power limits on the order of a few Watts, the power amplifiers are typically combined with other components in a low-cost integrated circuit. However power amplifiers are susceptible to unwanted harmonics. To reduce the energy in these unwanted harmonics, external harmonic filtering networks can be used. However if the integrated circuit generates harmonics with significant energy, then these networks require large order filters, resulting in higher parts counts and higher product costs. Moreover the harmonics generated at the input of the external harmonic filtering network can self-interfere with other circuits in the chip and create other problems.

BRIEF DESCRIPTION OF THE DRAWINGS

The present disclosure may be better understood, and its numerous features and advantages made apparent to those skilled in the art by referencing the accompanying drawings, in which.

The use of the same reference symbols in different drawings indicates similar or identical items. Unless otherwise noted, the word "coupled" and its associated verb forms include both direct connection and indirect electrical connection by means known in the art, and unless otherwise noted any description of direct connection implies alternate embodiments using suitable forms of indirect electrical connection as well.

DETAILED DESCRIPTION

Figure 1:
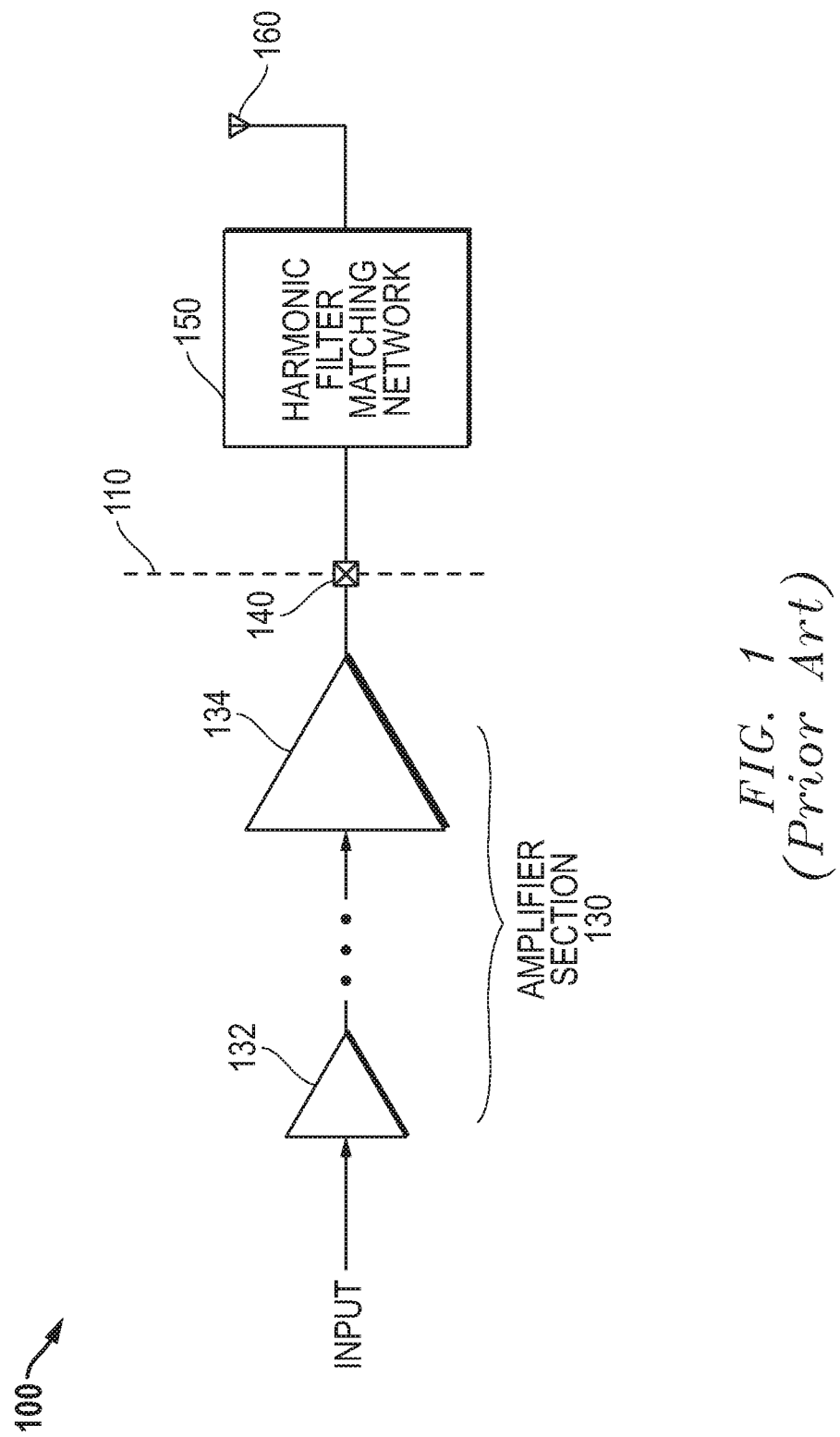
FIG. 1 illustrates in block diagram form a radio frequency (RF) transmission system known in the prior art.

FIG. 1 illustrates in block diagram form a radio frequency (RF) transmission system 100 known in the prior art. RF transmission system 100 includes generally an integrated circuit 110, a harmonic filter matching network 150, and an antenna 160. Integrated circuit 110 includes an amplifier section 130 and an integrated circuit terminal 140. Amplifier section 130 includes a set of power amplifiers connected serially including representative amplifiers 132 and 134. Amplifier 132 is a first amplifier of amplifier section 130 and has an input for receiving an input signal labeled "INPUT", and an output connected to a succeeding amplifier. Amplifier 134 is a last amplifier of amplifier section 130 and has an input connected to a preceding amplifier, and an output connected to integrated circuit terminal 140. Amplifier 134 is drawn larger than amplifier 132 to indicate that its output power level is larger than that of amplifier 132. Harmonic filter matching network 150 has an input connected to integrated circuit terminal 140, and an output connected to antenna 160.

To meet regulatory requirements for emissions, RF transmission system 100 includes harmonic filter matching network 150 external to integrated circuit 110. Harmonic filter matching network 150 includes discrete components such as inductors and capacitors and can be quite complex if amplifier section 130 generates harmonics with high energy. Thus if it were possible to reduce the order of harmonic filter matching network 150 or to eliminate it entirely, product cost could be reduced.

Figure 2:
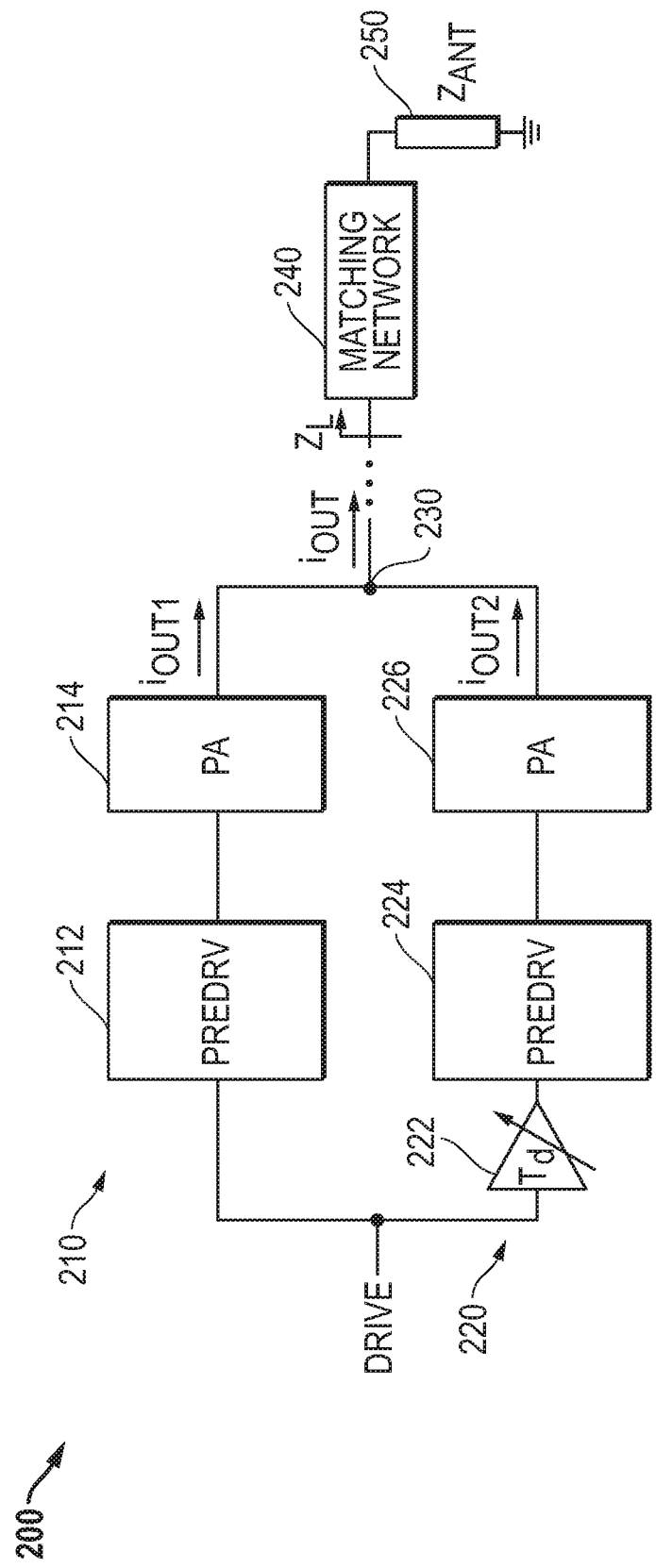
FIG. 2 illustrates in block diagram form a power amplifier system such as for RF transmission according to various embodiments disclosed herein.

FIG. 2 illustrates in block diagram form a power amplifier system 200 such as for RF transmission according to various embodiments disclosed herein. Power amplifier system 200 includes a first amplification path 210, a second amplification path 220, a node 230, a matching network 240, and an antenna 250. First amplification path 210 includes a predriver 212 and a power amplifier 214. Predriver 212 has an input for receiving a drive signal labeled "DRIVE", and an output. Power amplifier 214 has an input connected to the output of predriver 212, and an output connected to node 230 for providing a current labeled "$I_{OUT1}$". Second amplification path 220 includes a delay element 222, a predriver 224 and a power amplifier 226. Delay element 222 has an input for receiving the DRIVE signal, a control input, and an output. Predriver 224 has an input connected to the output of delay element 222, and an output. Power amplifier 226 has an input connected to the output of predriver 224, and an output connected to node 230 for providing a current labeled "$I_{OUT2}$". Node 230 forms a combination circuit and combines currents $I_{OUT1}$ and $I_{OUT2}$ to form an output current signal $I_{OUT}$ as a sum of $I_{OUT1}$ and $I_{OUT2}$. Matching network 240 has an input connected to node 230, and an output. Antenna 250 represents the electrical equivalent circuit of an antenna and has a first terminal connected to the output of matching network 240, and a second terminal connected to ground.

Power amplifier system 200 reduces unwanted harmonic energy by dividing the power amplifier into two matched amplification paths 210 and 220 whose outputs are combined by node 230. Power amplifier system 200 provides a signal path delay designated "$T_d$" to amplification path 220 with respect to 210. Note that while delay element 222 is placed before predriver 224 in amplification path 220, it could be placed anywhere at any suitable place in amplification path 220. Moreover delay element 222 can be implemented in a variety of ways. For example, it could be implemented with a chain of inverters or buffers whose drive current is controlled in response to the control signal. Also it could be implemented as part of an existing amplifier in the chain such as predriver 224 or power amplifier 226.

It can be shown mathematically power amplifier system 200 is able to cancel energy in a harmonic of the fundamental frequency determined by the value of $T_d$. The current into matching network 240 $I_{OUT}$ can be expressed as follows:

$$i_{OUT} = i_{OUT1}(t) + i_{OUT2} = i_{OUT1}(t) + i_{OUT1}(t-T_d) \quad [1]$$

If we define the Laplace transform of $i_{OUT1}(t)$ as $\mathcal{L}(i_{OUT1}(t)) = I_{OUT1}(s)$, then $$\mathcal{L}(i_{OUT1}(t-T_d)) = I_{OUT1}(S) * e^{-sTd} \quad [2]$$

Hence:

$$\mathcal{L}(i_{OUT}(t)) = I_{OUT}(S) = I_{OUT1}(S) + I_{OUT1}(S) * e^{-sTd} = I_{OUT1}(S) * (1 + e^{-sTd}) \quad [3]$$

And:

$$I_{OUT}(j\omega) = 2 * I_{OUT1}(j\omega) * \cos\left(\frac{\omega Td}{2}\right) \quad [4]$$

If $\omega_0$ is the fundamental frequency of the carrier, then at frequency $\omega = n\omega_0$, in which n can be an integer to indicate the number of the harmonic:

$$I_{OUT}(jn\omega_0) = 2 * I_{OUT1}(jn\omega_0) * \cos\left(\frac{n\omega 0 Td}{2}\right) \quad [5]$$

Thus to attenuate the $n^{th}$ harmonic, $$\cos\left(\frac{n\omega 0 Td}{2}\right)$$

should be made 0 by making $$\frac{n\omega 0 Td}{2} = \frac{\pi}{2}.$$

Stated another way, to attenuate the $n^{th}$ harmonic, $$T_d = \frac{T}{2n},$$

where T is defined as the fundamental time period of the carrier corresponding to angular frequency of $\omega_0$ For example to reduce the second harmonic (n=2), $T_d$ is set to T/4. If the delay is exactly matched to T/4, then power amplifier system 200 would provide infinite attenuation at the second harmonic. In a practical system in which the delay can vary by ±20%, then power amplifier system 200 would still provide at least 10 decibels (dB) of attenuation, which would make it possible to reduce the order of external matching network 240 by one. If the delay varies only by ±10%, then there would be about 16 dB of attenuation, and if the delay varies only by as much as ±5%, then there would be greater than 22 dB of attenuation. However, using this technique to attenuate second harmonics, the power at the fundamental is reduced by $$\cos\left(\frac{\pi}{4}\right) = 3$$

dB. Thus with a modest loss of 3 dB of power at the fundamental, it is possible to achieve up to about 20 dB of attenuation at the second harmonic if the system can be calibrated to ±5%, or at least achieve 10 dB of attenuation in an uncalibrated system with 20% delay variation.

To reduce power of the third harmonic (n=3), $T_d$ is set to T/6. With a modest loss of 1.2 dB of power at the fundamental, it is possible to achieve up to about 20 dB of attenuation at the third harmonic if the system can be calibrated to ±5%, or at least achieve 10 dB of attenuation in an uncalibrated system with 20% delay variation. When reducing the third harmonic, the reduction of power at the fundamental is only 1.2 dB, smaller than the 3 dB attenuation for the second harmonic attenuation due to the greater separation in frequency from the fundamental to the third harmonic compared to the second harmonic. Thus, this technique is very useful for $3^{rd}$ harmonic attenuation or higher order harmonic attenuation.

In other embodiments, the power amplifier system could include more than two amplification paths. Second and higher amplification paths would match the first amplification path with respective delays and all the amplification path output signals are summed with a combination element such as current summing node. With the proper choice of delays, the summed signal will have an attenuation at the desired frequency.

Figure 3:
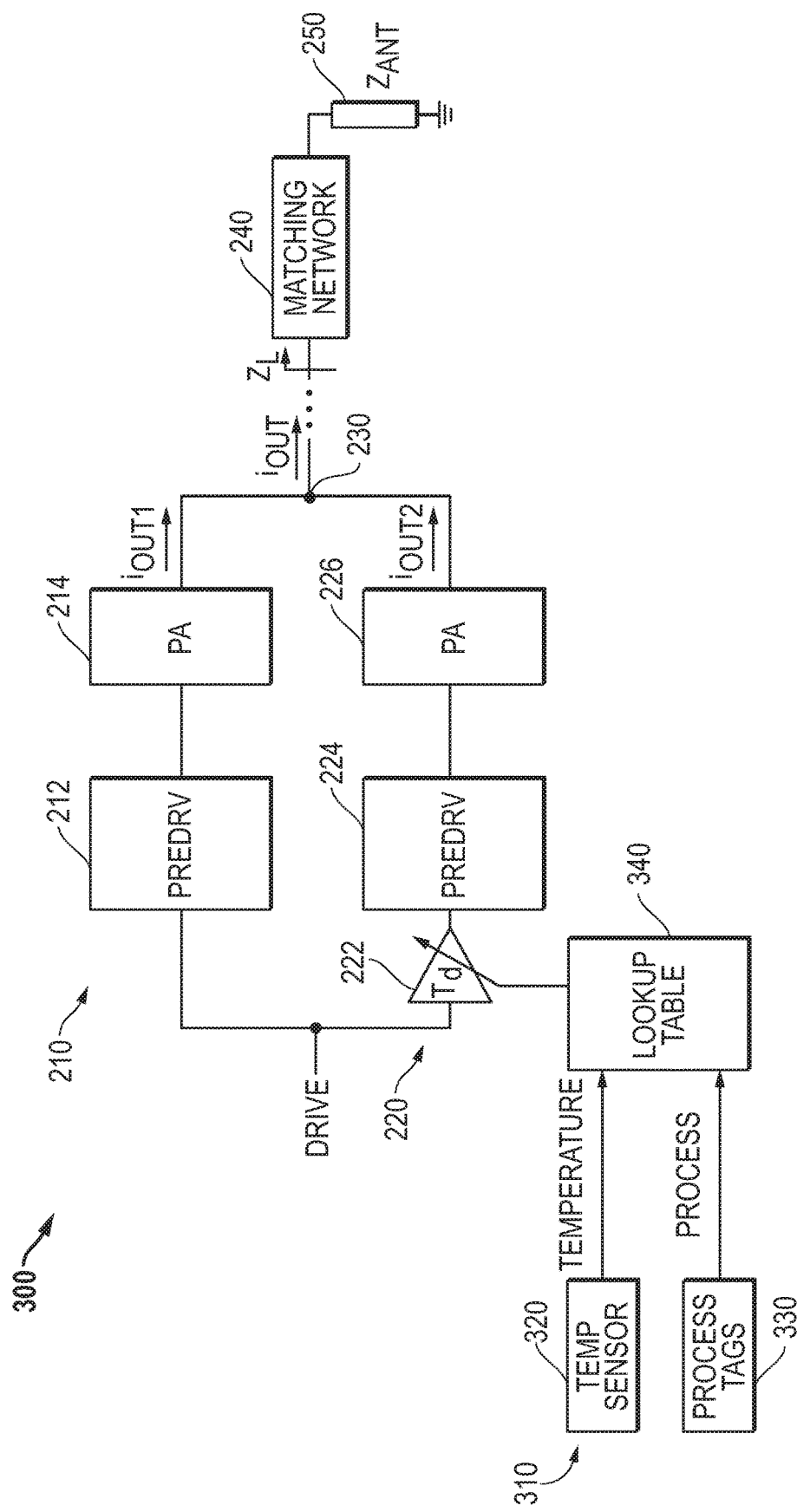
FIG. 3 illustrates in block diagram form a power amplifier system with temperature compensation according to an embodiment.

FIG. 3 illustrates in block diagram form a power amplifier system 300 with temperature compensation according to an embodiment. Power amplifier system 300 adds a delay setting circuit 310 to power amplifier system 200. Delay setting circuit 310 includes a temperature sensor 320, a process tags circuit 330, and a lookup table 340. Temperature sensor 320 has an output for providing a temperature signal labeled "TEMPERATURE". Process tags block 330 has an output for providing a process signal labeled "PROCESS". Lookup table 340 has a first input connected to the output of temperature sensor 320, a second input connected to the output of process tags circuit 330, and an output connected to the control input of delay element 222.

Temperature sensor 320 is an on-chip temperature sensor that continuously or periodically outputs the TEMPERATURE signal as a voltage proportional to the die temperature. Process tags circuit 330 is a set of memory elements that indicates the particular processing parameters within the processing window. The process tags could be set by programming fuses when process parameters are measured during fabrication. For example, the threshold voltage of P-channel transistors may be toward the high end of the process window, whereas the threshold voltage of N-channel transistors may be toward the low end of the process window. In this case, CMOS inverters switch relatively fast going from high to low and relatively slow switching from low to high. Lookup table 340 correlates the temperature and manufacturing parameters to the effect on the speed of delay element 222, and compensates for the variation within the temperature operating window and the manufacturing process window. By this mechanism delay setting circuit 310 can achieve a delay to a tolerance of ±5% or lower in modern CMOS fabrication processes.

Figure 4:
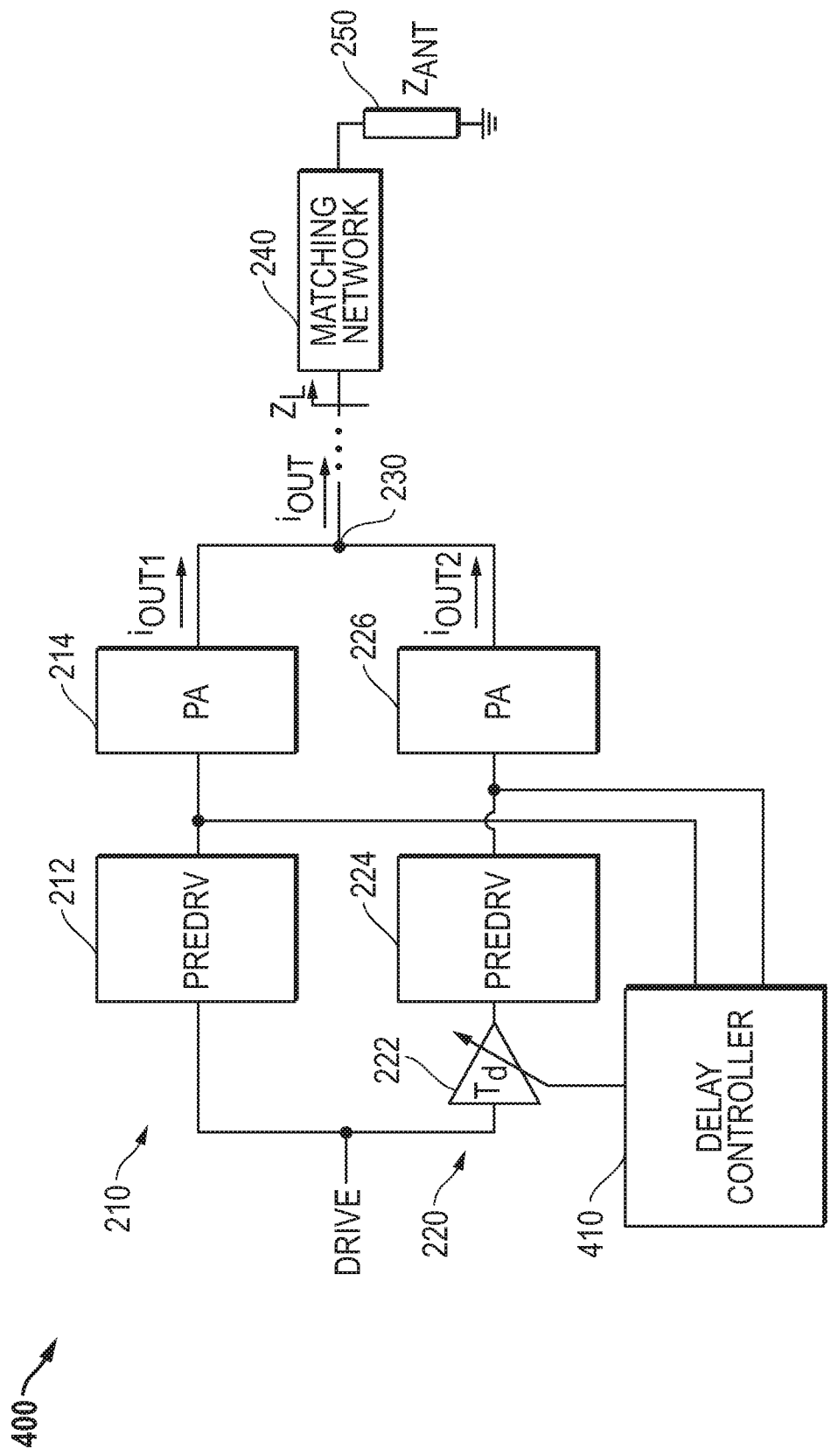
FIG. 4 illustrates in block diagram form a power amplifier system with delay calibration according to one embodiment.

FIG. 4 illustrates in block diagram form a power amplifier system 400 with delay calibration according to one embodiment. Power amplifier system 400 adds a delay setting circuit 410 to power amplifier system 200. Delay setting circuit 410 is formed with a delay controller having a first input connected to the output of predriver 212, a second input connected to the output of predriver 224, and an output connected to the control input of delay element 222. Delay setting circuit 410 uses closed loop feedback to measure the delay between first amplification path 210 and second amplification path 220. It compares the measured delay to the desired delay and changes the delay of delay element 222 by changing its control input. Note that calibration can be done in a special test mode, or during real-time operation.

Figure 5:
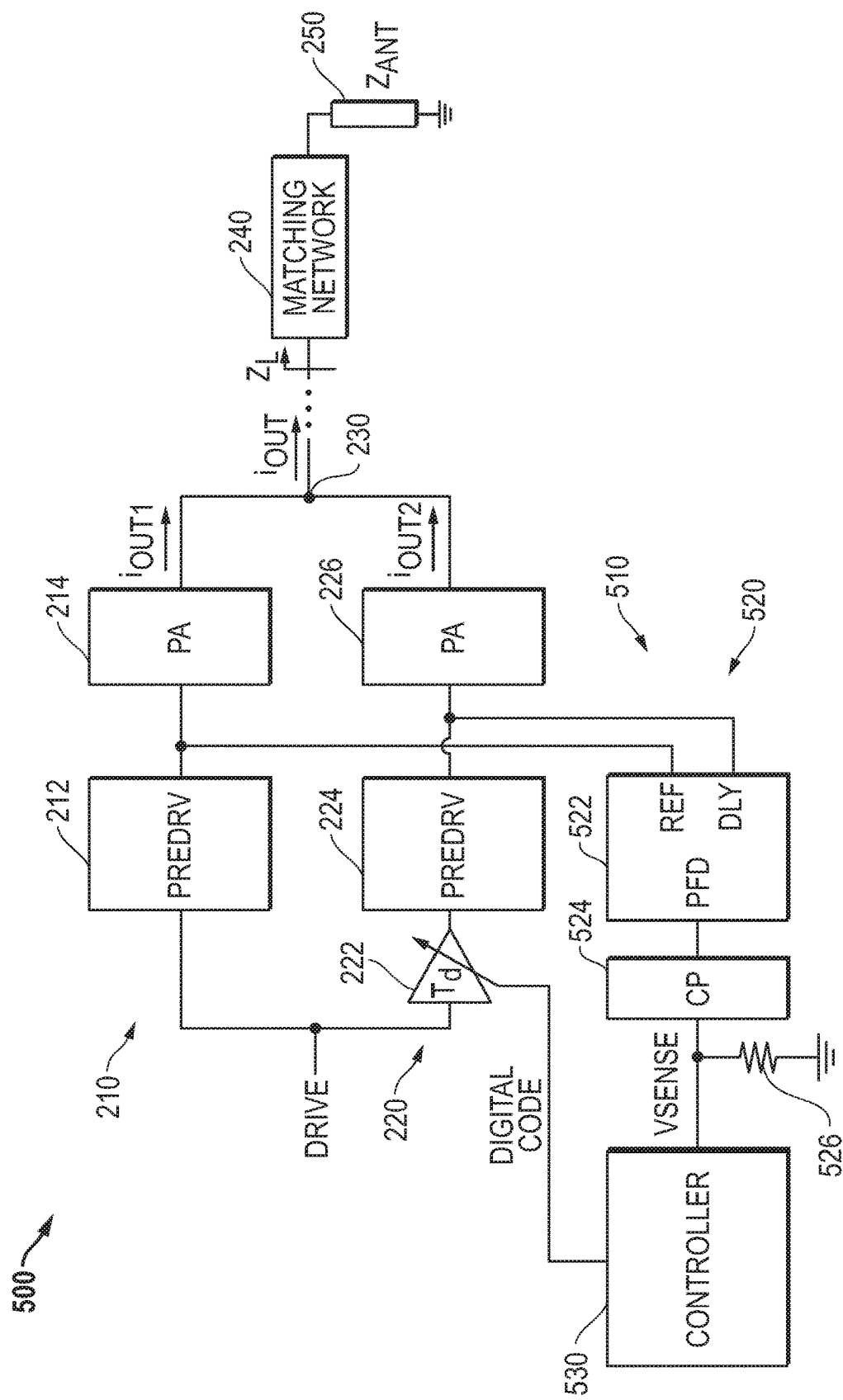
FIG. 5 illustrates in block diagram form a power amplifier system with delay calibration according to another embodiment.

FIG. 5 illustrates in block diagram form a power amplifier system 500 with delay calibration according to one implementation of a delay setting circuit 510. Delay setting circuit 510 includes a delay measurement circuit 520 and a controller 530. Delay measurement circuit 520 includes a phase and frequency detector 522, a charge pump 524, and a resistor 526. Phase and frequency detector 522 has a first input connected to the output of predriver 212, a second input connected to the output of predriver 224, and an output. Charge pump 524 has an input connected to the output of phase and frequency detector 522, and an output. Resistor 526 has a first terminal connected to the output of charge pump 524, and a second terminal connected to ground and forms a voltage at the output of charge pump 524 labeled "VSENSE". Controller 530 has an input connected to the first terminal of resistor 526, and an output connected to the control input of delay element 222 for providing a control signal labeled "DIGITAL CODE" thereto.

Delay setting circuit 510 uses closed loop feedback to measure the delay between transitions of the DRIVE signal at the output of predriver 212 and the delayed version of the DRIVE signal at the output of predriver 224. Phase and frequency detector 522 provides a digital signal that is active after a transition of the output of predriver 212 and before the corresponding transition in predriver 224. Charge pump 524 then drives the average current into resistor 526 to form voltage VSENSE. Controller 530 detects the difference between VSENSE and an analog voltage level corresponding to the desired delay, and adjusts the DIGITAL CODE in response. Delay setting circuit 510 adjusts the delay of delay element 222 to equal the desired delay.

In another embodiment similar to power amplifier system 500, the delay can be set using a delay locked loop (DLL). In this case, the DLL and supporting circuitry divide the period of the fundamental into small increments, and the delay corresponding to 1/2n of the period is used set the delay in the second amplification path.

Figure 6:
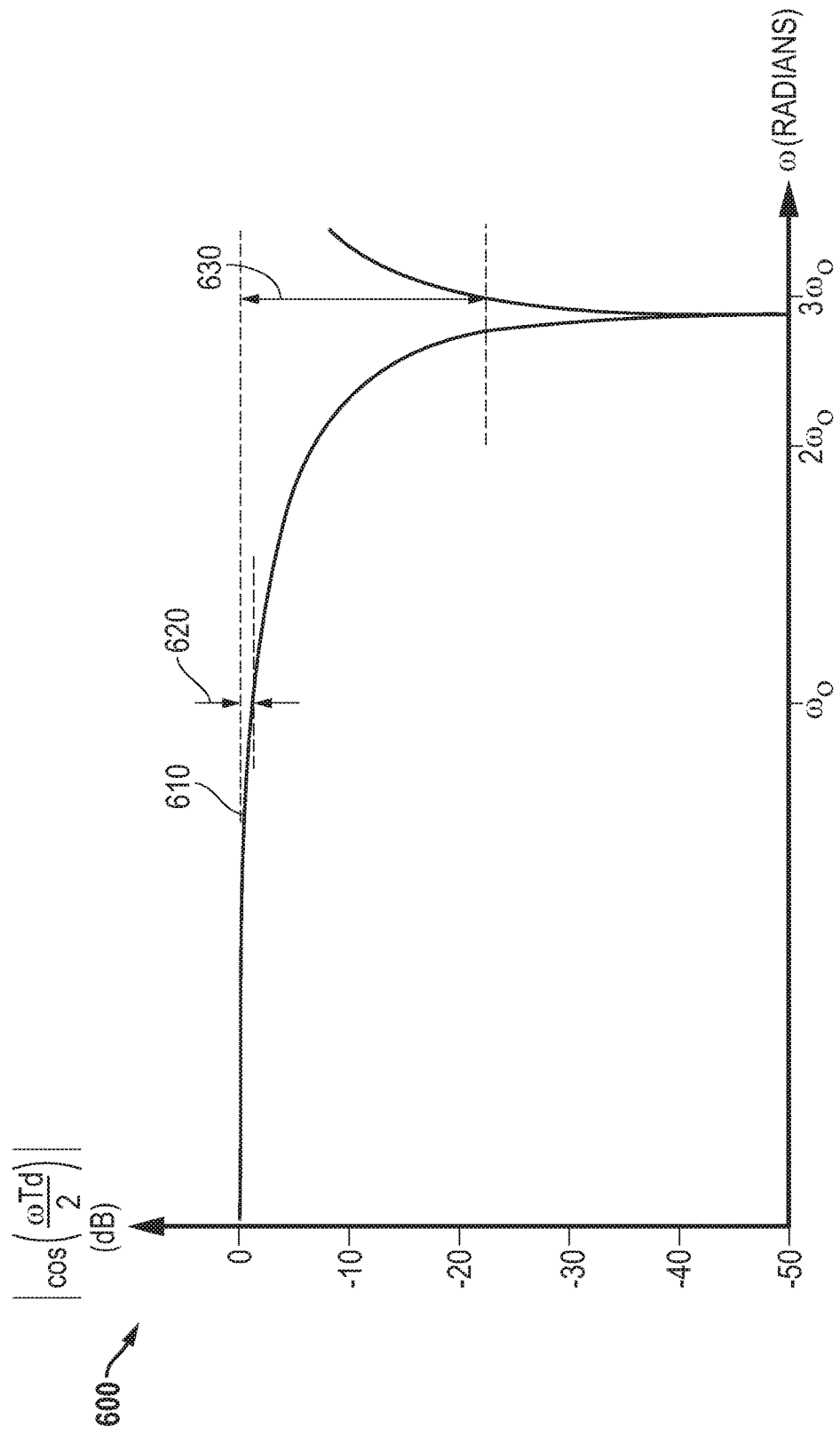
FIG. 6 illustrates a graph showing the frequency response of the power amplifier system of FIG. 2.

FIG. 6 illustrates a graph 600 showing an example of the frequency response of the power amplifier system 200 of FIG. 2. In FIG. 6, the horizontal axis represents the logarithm of natural frequency co in radians, and the vertical axis represents $$\left|\cos\left(\frac{\omega T d}{2}\right)\right|$$

in decibels (dB). A curve 610 represents the transfer function as co varies in frequency. In the example of FIG. 6, $T_d$ has been set for third harmonic reduction, i.e. $T_d$ is set to approximately T/6. Curve 610 exhibits a notch in the transfer function close to, but not exactly at, $3\omega_0$. Curve 610 has an attenuation 620 at $\omega_0$ and an attenuation 630 at $3\omega_0$, and in the example of FIG. 6 power amplifier system 200 achieves over 22 dB of attenuation at $3\omega_0$ while incurring a cost of only slightly more than 1 dB at coo.

Using this technique, a user can choose to attenuate predominantly one particular harmonic my setting $T_d$ to approximately T/2n. However because of the attenuation of nearby harmonics, $T_d$ can be chosen to be non-integer and therefore to simultaneously attenuate multiple harmonics. Thus for example the notch in the frequency response can be intentionally placed between the two harmonics of interest to provide significant attenuation at both harmonics.

The above-disclosed subject matter is to be considered illustrative, and not restrictive, and the appended claims are intended to cover all such modifications, enhancements, and other embodiments that fall within the true scope of the claims. The disclosed power amplifier systems reduce the harmonic energy by using parallel matched amplification paths but adding a delay element in one amplification path relative to the other. The delay can be used to reduce a selected harmonic in the output signal that may be important in the given operation environment. The disclosed technique is especially useful for reducing the power in the third harmonic since the delay only reduces the level of the fundamental by 1.2 dB. However it also can be used for second harmonic reduction if a loss of fundamental power of 3 dB is tolerable. Moreover the power amplifier system can use either an open loop technique or a closed loop feedback technique based on directly sensing the delay to calibrate the delay to within a small amount to reduce the energy in the desired harmonic. In various embodiments using closed loop feedback, the delay element and controller could use an analog delay instead of a digital delay. Also the delay measurement circuit could measure the signal and delayed version at different points in their respective amplification paths, such as at the inputs of the predrivers (instead of the outputs). The disclosed technique can be applied to various circuit architectures, including differential and single-ended, as well as to different power amplifier topologies with open drain N-channel metal-oxide-semiconductor (NMOS), open drain P-channel MOS (PMOS), complementary MOS (CMOS), and the like.

Thus, to the maximum extent allowed by law, the scope of the present invention is to be determined by the broadest permissible interpretation of the following claims and their equivalents, and shall not be restricted or limited by the foregoing detailed description.

What is claimed is:

1. A power amplifier system, comprising:
a first amplification path having an input for receiving a drive signal, and an output;
a second amplification path having an input coupled to said input of said first amplification path, and an output, wherein the second amplification path has a delay element that inserts a signal path delay with respect to said first amplification path, wherein said delay element has a delay corresponding to a harmonic that is desired to be reduced, wherein said delay element has a control input for setting a delay of said delay element;
a delay setting circuit coupled to said control input of said delay element for setting a delay of said delay element in response to a desired harmonic of an output signal to be suppressed; and
a combination element coupled to said output of said first amplification path and an output of said second amplification path for providing said output signal as a sum of outputs of said first amplification path and said second amplification path.

2. The power amplifier system of claim 1 wherein:
said first amplification path comprises a predetermined number of amplification elements; and
said second amplification path comprises said predetermined number of amplification elements, wherein each amplification element in said second amplification path matches a corresponding amplification element in said first amplification path.

3. The power amplifier system of claim 1, wherein:
said delay element has a delay corresponding to, wherein T/2n, is equal to a period of a fundamental frequency of said drive signal, and n is equal to a number of said harmonic.

4. The power amplifier system of claim 1, further comprising:
said delay setting circuit further sets a delay of said delay element in response to a value of an operating parameter.

5. The power amplifier system of claim 4, wherein said delay setting circuit further sets a delay of said delay element in response to a temperature and process parameters of the power amplifier system.

6. The power amplifier system of claim 4, wherein said delay setting circuit further sets a delay of said delay element in response to calibrating said delay setting circuit.

7. The power amplifier system of claim 1, further comprising:
at least one additional amplification path having an input coupled to said input of said first amplification path, and an output coupled to said combination element, wherein each additional amplification path has a delay element that inserts a signal path delay with respect to said first amplification path, wherein said delay element has a delay corresponding to a harmonic that is desired to be reduced.

8. A power amplifier system, comprising:
a first amplification path having an input for receiving a drive signal, an output, and a predetermined number of amplification elements;
a second amplification path having an input coupled to said input of said first amplification path, and an output, wherein the second amplification path has said predetermined number of amplification elements in which each amplification element in said second amplification path matches a corresponding amplification element in said first amplification path, and a delay element that inserts a signal path delay with respect to said first amplification path, wherein said delay element has a control input for receiving a control signal and varies said signal path delay in response to said control signal;
a delay setting circuit for providing said control signal in response to a harmonic of said drive signal desired to be suppressed; and
a combination element coupled to said output of said first amplification path and an output of said second amplification path for providing an output signal as a sum of outputs of said first amplification path and said second amplification path.

9. The power amplifier system of claim 8, wherein:
said first amplification path provides a first current signal to said output thereof;
said second amplification path provides a second current signal to said output thereof; and
said combination element is a current summing node that provides an output current signal as a sum of said first current signal and said second current signal.

10. The power amplifier system of claim 8, wherein:
said delay setting circuit provides said control signal further in response to an operating parameter of the power amplifier system.

11. The power amplifier system of claim 10, wherein said operating parameter comprises a temperature of the power amplifier system.

12. The power amplifier system of claim 10, wherein said operating parameter comprises process parameters of circuit elements of the power amplifier system.

13. The power amplifier system of claim 10, wherein said delay setting circuit comprises:
a temperature sensor having an output for providing a temperature;
a process tags circuit for providing indications of a plurality of process parameters of the power amplifier system; and
a lookup table having inputs coupled to said temperature sensor and said process tags circuit and an output for providing said control signal.

14. The power amplifier system of claim 8, wherein:
said delay setting circuit comprises a delay calibration circuit that provides said control signal further using closed loop feedback.

15. The power amplifier system of claim 14, wherein said delay setting circuit comprises:
a phase difference circuit having a first input coupled to said first amplification path, a second input coupled to said second amplification path, and an output for providing a sense voltage proportional to a phase difference between said first and second inputs thereof; and
a controller having an input coupled to said output of said phase difference circuit, and an output for providing said control signal, wherein said controller changes said control signal to reduce a difference between said sense voltage and a reference voltage.

16. The power amplifier system of claim 15, wherein:
said controller further calibrates said delay element before changing said control signal to reduce a difference between said sense voltage and a reference voltage in a calibration mode.

17. The power amplifier system of claim 16, wherein said phase difference circuit comprises:
a phase and frequency detector having a first input coupled to said first amplification path, a second input coupled to said second amplification path, and an output;
a charge pump for providing a current in response to said output of said phase and frequency detector; and
a resistor having a first terminal coupled to said output of said charge pump, and a second terminal coupled to a power supply voltage terminal.

18. The power amplifier system of claim 8, further comprising:
at least one additional amplification path having an input coupled to said input of said first amplification path, and an output coupled to said combination element, wherein each additional amplification path has said predetermined number of amplification elements in which each amplification element in each additional amplification path matches a corresponding amplification element in said first amplification path, and a delay element that inserts a signal path delay with respect to said first amplification path.

19. A method for reducing harmonics generated in an amplifier system, comprising:
receiving a drive signal;
amplifying said drive signal in a first amplification path to provide a first amplified signal;
separately amplifying said drive signal in a second amplification path to provide a second amplified signal;
delaying said second amplified signal using a delay element having a control input for receiving a control signal that varies a signal path delay in response to said control signal;
providing said control signal with a value corresponding to a harmonic that is desired to be reduced; and
combining said first amplified signal and said second amplified signal to provide an output signal.

20. The method of claim 19, wherein:
said amplifying said drive signal comprises amplifying said drive signal in said first amplification path using a predetermined number of amplification elements to provide said first amplified signal;
said separately amplifying said drive signal comprises separately amplifying said drive signal in said second amplification path using said predetermined number of amplification elements to provide a second amplified signal; and
matching each amplification element in said second amplification path to a corresponding amplification element in said first amplification path.

21. The method of claim 19, wherein:
calibrating said delaying said second amplified signal comprises delaying using a delay corresponding to T/2n, wherein T is equal to a period of a fundamental frequency of said drive signal, and n is equal to a number of a selected harmonic.

22. The method of claim 19, wherein said delaying comprises:
setting a delay of said delay element using a value of an operating parameter according to a predetermined correspondence between said operating parameter and said delay.

23. The method of claim 22, wherein said selecting further comprises:
selecting said delay using a temperature of the amplifier system.

24. The method of claim 22, wherein said selecting further comprises:
selecting said delay using process parameters of the amplifier system.

25. The method of claim 19, further comprising:
separately amplifying said drive signal in at least one additional amplification path to provide at least one corresponding amplified signal;
delaying said at least one corresponding amplified signal using a corresponding delay element having a control input for receiving a corresponding control signal that varies a corresponding signal path delay in response to said corresponding control signal;
providing said corresponding control signal with a value corresponding to a corresponding harmonic that is desired to be reduced; and
combining said first amplified signal, said second amplified signal, and each additional amplified signal to provide said output signal.

* * * * *